(12) United States Patent
Sharma et al.

(10) Patent No.: US 10,659,053 B2
(45) Date of Patent: May 19, 2020

(54) LIVE POWER ON SEQUENCE FOR PROGRAMMABLE DEVICES ON BOARDS

(71) Applicant: HONEYWELL INTERNATIONAL INC., Morris Plains, NJ (US)

(72) Inventors: Gautam V. Sharma, Andhra Pradesh (IN); Amit Kumar, Andhra Pradesh (IN)

(73) Assignee: Honeywell International Inc., Morris Plains, NJ (US)

( * ) Notice: Subject to any disclaimer, the term of this patent is extended or adjusted under 35 U.S.C. 154(b) by 106 days.

(21) Appl. No.: 15/439,658

(22) Filed: Feb. 22, 2017

(65) Prior Publication Data
US 2018/0241399 A1 Aug. 23, 2018

(51) Int. Cl.
| | | |
|---|---|---|
| *G06F 1/32* | (2019.01) | |
| *G06F 1/26* | (2006.01) | |
| *H03K 19/177* | (2020.01) | |
| *H03K 19/17772* | (2020.01) | |
| *H03K 19/1776* | (2020.01) | |
| *G06F 9/4401* | (2018.01) | |

(52) U.S. Cl.
CPC ....... *H03K 19/17772* (2013.01); *G06F 1/263* (2013.01); *H03K 19/1776* (2013.01); *G06F 9/4403* (2013.01)

(58) Field of Classification Search
CPC .................................... G06F 1/32; G06F 1/26
See application file for complete search history.

(56) References Cited

U.S. PATENT DOCUMENTS

| | | | |
|---|---|---|---|
| 6,236,250 B1 | 5/2001 | Salmon et al. | |
| 7,456,525 B2 | 11/2008 | Rhodes et al. | |
| 2006/0133368 A1* | 6/2006 | Tolliver | G06F 1/266 370/389 |
| 2007/0192639 A1* | 8/2007 | Nichols | G06F 1/3203 713/300 |
| 2008/0122416 A1* | 5/2008 | Cowell | G05F 1/56 323/280 |
| 2009/0070613 A1 | 3/2009 | O'brien | |
| 2009/0307476 A1* | 12/2009 | Khatri | G06F 9/4401 713/2 |
| 2013/0106494 A1* | 5/2013 | Takayanagi | H03K 19/0016 327/434 |
| 2013/0268747 A1* | 10/2013 | Chang | G06F 13/14 713/2 |

(Continued)

*Primary Examiner* — Phil K Nguyen

(57) ABSTRACT

A PCB includes a programmable logic device (PLD), a memory, a live power ON sequence algorithm, and other electronics. The PLD is connectable to a primary DC power supply. The PLD is configurable by a configuration memory device having stored PLD configuration information. Upon completion of the configuring the PLD generates a PLD control signal or the algorithm triggers generation of a PLD control signal substitute to indicate a configuration of PLD is complete and the PLD is in active mode. Power coupling includes the primary DC power supply coupled to a power input of an electronic switch or the primary DC power supply wiring coupled to a power input of a second DC power supply. The PLD control signal or substitute provides an enable signal that controls power arriving through the electronic switch or from the second DC power supply to the other electronics.

16 Claims, 5 Drawing Sheets

(56) References Cited

U.S. PATENT DOCUMENTS

| | | | |
|---|---|---|---|
| 2013/0282191 A1* | 10/2013 | Okuda | G05F 5/00 700/286 |
| 2016/0048184 A1* | 2/2016 | Basile | G06F 1/26 713/310 |
| 2018/0095510 A1* | 4/2018 | Tsao | G06F 1/266 |

* cited by examiner

LIVE POWER ON SEQUENCE FOR PROGRAMMABLE DEVICES ON BOARDS

FIELD

Disclosed embodiments relate to the power ON sequencing of programmable devices on circuit boards.

BACKGROUND

Circuits used in many circuit board-based electronic products include one or more field-programmable gate array (FPGAs) and/or other programmable devices. Programmable devices include programmable logic devices (PLDs) which are electronic components used to build digital circuits that are reprogrammable. A PLD does not have a defined function as manufactured unlike programmable logic arrays, look-up tables and programmable interconnects. Generally, the PLD needs to be programmed before it can be used. There are several different types of active devices apart from a basic PLD further referred to as a FPGA or system-on-a-chip (SoC) on a printed circuit board (PCB) including a complex programmable logic device (CPLD), hardcore processor, microcontroller mixed signal PLD, and some application-specific integrated circuits (ASICs). These devices are intended to properly function at power ON.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize PLDs such as FPGAs and some ASICs embodied as a SoC being programmable in nature have an associated configuration time. Thus, their configuration time with respect to on-board devices (e.g., a digital subsystem) that do not require programming makes PLDs (e.g., FPGAs) unsuitable to implement logic which requires live power ON functionality apart from its needs of programmability and scalability.

Disclosed live power ON sequence embodiments enable a PLD on a PCB to be available for its intended function at power ON, making it is possible to implement live power ON functionality of an on-board active electronic device (e.g., a digital subsystem) that is also on the PCB with or in some case without the conventional requirement for performing an initial power ON analysis and/or other initial digital logic analysis. The known power ON analysis comprises the evaluation of signal status (which can be digital logic high or digital logic low) at first power ON and the digital logic analysis comprises the behavioral, structural and dataflow analysis of the digital logic circuit which can be implemented or minimized to be part of PLD.

In known art, for such system requirements, the system designer may choose an ASIC available as a one-to-one functional replacement for a device which is obsolete or do a proof of concept (PoC) for a newer ASIC device to perform same logic function to make it functionally compatible and meet a re-designed PCB's functional requirement(s). Problems with ASIC as a one-to-one functional replacements include but not limited to electrical and timing specification (for e.g. for rise/fall time, slew rate) mismatch, IO mismatch, dimension mismatch, speed grade change due to fabrication technology mismatch. Depending on the above analysis, the PLD control signal can be supplied as per specification requirement of the mismatch found to its enable input of the electronic switch or to the second DC power supply.

Disclosed embodiments include a method of controlling the power ON of electronics on a PCB that also includes a PLD (e.g., FPGA or SoC) that waits until the PLD turns ON first to obtain the advantage of the PLD's availability for live power ON digital subsystem implementation on the PCB. Advantages of disclosed power ON sequence embodiments include maintaining proper state of general and/or multi-purpose input/outputs (IOs) and/or power pins. This ensures the PLD under configuration after power ON is not conflicting with rest of the on-board electronics and can complete its configuration with a known state of all types of IOs to the PCB circuit during its configuration time.

Pull-up and pull-down resistors and an electronic circuit containing a resistor-capacitor network or series terminations for switching hazard (which is the further described below as a change in phase or shape of the PLD control signal) can be provided because of a sudden change in DC power supply voltage at the time of electronic switch or second power supply turns ON for PLD IOs requirements can be pre-determined during early PCB design analysis and/or power analysis, where the device and/or component can be the part of the PCB. As used herein, a PCB includes a conventional PCB which provides both point-to-point connections and mounted components in a printed component area in a predetermined arrangement on a common base (board material) and also a Printed Wiring Board which provides point-to-point connections but not mounted components in a printed component area in a predetermined arrangement on a common base.

DETAILED DESCRIPTION

Figure 1:
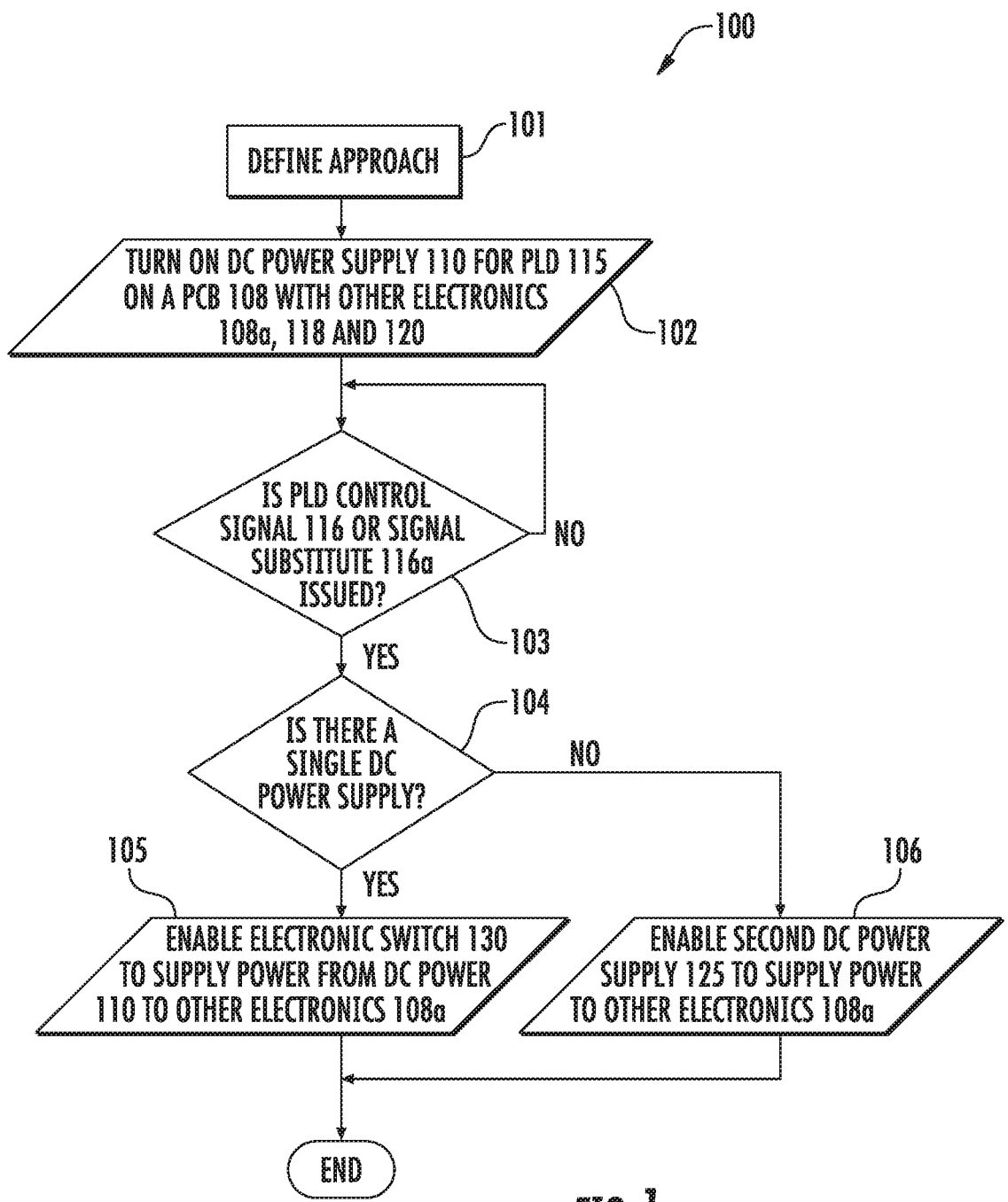
FIG. 1 is a flow chart that shows steps in an example method of a controlling power-ON sequencing for electronics on a PCB including at least one PLD, according to an example embodiment.

Disclosed embodiments are described with reference to the attached figures, wherein like reference numerals are used throughout the figures to designate similar or equivalent elements. The figures are not drawn to scale and they are provided merely to illustrate certain disclosed aspects. Several disclosed aspects are described below with reference to example applications for illustration. It should be understood that numerous specific details, relationships, and methods are set forth to provide a full understanding of the disclosed embodiments.

One having ordinary skill in the relevant art, however, will readily recognize that the subject matter disclosed herein can be practiced without one or more of the specific details or with other methods. In other instances, well-known structures or operations are not shown in detail to avoid obscuring certain aspects. This Disclosure is not limited by the illustrated ordering of acts or events, as some acts may occur in different orders and/or concurrently with other acts or events. Furthermore, not all illustrated acts or events are required to implement a methodology in accordance with the embodiments disclosed herein.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

The number descriptions used herein are as follows:
108 A PCB or printed wiring assembly with circuit components.
108a Other electronics on the PCB which can be programmable components such as a digital logic integrated circuit, CPLD, FPGA, ASIC, ASSP, programmable processor, or other components referred as "digital subsystems".
109 DC output power source wiring for the other electronics 108a.
110 Primary DC power supply on the PCB 108 which can source power to the PCB.
111 DC primary power source wiring for coupling power from the primary DC power supply 110 to the PLD 115, to the configuration device 118, to the electronic switch 130 and to the clock 120 at initial power on.
112 DC power source(s) wiring for coupling power to primary power source 110 (in FIG. 2) or for coupling power to primary power source 110 and second power supply 125 (in FIG. 3).
115 PLD that is reconfigurable such as a FPGA or SoC.
115a Memory to store a live power ON sequence algorithm 115b inside the PLD or elsewhere on the PCB 108.
115b Live power ON sequence algorithm stored in the memory 115a.
115d PLD control signal output
116 PLD control signal from the PLD control signal output 115d which comprises a configuration complete control signal or clock stable output valid control signal.
116a PLD control signal substitute 116a triggered by the live power ON sequence algorithm 115b.
117 Optional inverter(s) for inverting the PLD control signal 116 or PLD control signal substitute 116a.
118 Configuration memory device(s) having stored configuration information for configuring the PLD.
119 A logic device such as a hardcore processor, System on Chip, ASIC or ASSP that can be triggered by the live power ON power sequence algorithm 115b to provide a PLD control signal substitute 116a.
120 Clock source to the PLD 115 and other circuitry on the PCB 108.
125 Second DC power supply including power supply lines connected to other electronics 108a on the PCB 108 (FIG. 3 only).
130 Electronic switch to turn-on power from the primary DC power supply 110 to the other electronics 108a on the PCB 108 (FIG. 2 only).
131 Noise filter.

FIG. 1 is a flow chart that shows steps in an example method 100 of a controlling power-ON sequence for a system comprising a PCB 108 including at least one PLD 115, other electronics 108a and a memory 115a with a live power ON sequence algorithm 115b stored thereon, where the PLD 115 can generate a PLD control signal 116 that controls the power-ON sequencing, according to an example embodiment. Most PLDs include memory elements, which may be simple flip-flops or more complete blocks of memory. Alternatively, as described below, for cases where PLD control signal is not available from the PLD, the live power ON sequence algorithm 115b can be used to alternatively trigger the generation of a PLD control signal substitute 116a that is similar to the PLD control signal to provide the same function using another logic device.

The PLD 115 is connected to a DC power supply 110 for receiving DC power. As described above, the memory 115a can be inside PLD 115 (e.g., in the application software of SOC containing a programmable processor), in the configuration memory device 118, or elsewhere embedded in a hardware processor, ASSP or ASIC which includes the memory 115a residing on the PCB 108.

Step 101 comprises defining the approach. In the early consideration of a new PCB-based product or re-design for a target system designed on a PCB, an initial hardware analysis in-terms of power domains, interconnects within the PLD 115 and/or the rest of board level circuitry is generally performed by referring to available board or PWA schematics and/or reviewing existing layout routing of interconnects. For example, Gerber (a standard electronics industry file format used to communicate design information to manufacturing for many types of printed circuit boards) can be used to select single-power supply sequencer or multiple-power supply sequencer.

Step 102 comprises turning ON the power from the primary power supply 110 to provide DC power to the PLD 115, to the configuration memory device 118 (e.g., flash memory device) having initial power on configuration information for the PLD 115, and to a clock source 120, where the configuration memory device 118 and clock source 120 are coupled to respective inputs of the PLD 115. In some cases the clock source 120 can be supplied with power so that it provides clocking during the programming, or the PLD 115 can provide the clock source 120, or the clock source 120 can be supplied by the configuration memory device 118 depending on the PLD's 115 power ON mode selection. The timing of the turning ON of the power from the primary power supply 110 can be uncontrolled or can be controlled if the PCB 108 is supplied with power by another PCB in a predefined turn on sequence as per the system requirement and the PCB 108 can turn ON as soon as board input power is available from a power source external to the PCB 108.

Upon completion of configuring the PLD 115, the PLD 115 can output a PLD control signal 116 that as described above can be a configuration complete control signal or a clock stable output valid control signal. No special programming of the PLD 115 is generally needed to output a configuration complete control signal, and if needed the PLD can be made to vary its assertion using a clock delay at its output pin by a supplier specific tool for the PLD 115 as this is a core inherent feature for most of PLDs such as FPGA or SoC-based to acknowledge the self-configuration is complete. For the few cases where the PLD control signal 116 is not available from the PLD 115, the live power ON sequence algorithm 115b can be used to alternatively trigger the generation of a PLD control signal substitute 116a that is similar to the PLD control signal 116 and provides the same function using another logic device shown as 119 in FIG. 2 (e.g., hardcore processor, System on Chip, ASICs and/or ASSPs). The PLD control signal 116 or PLD control signal substitute 116a may be optionally polarity inverted by the optional inverter(s) 117 shown in FIGS. 2 and 3 if the control signal is received in the opposite (inverted) polarity to the polarity needed.

Step 103 comprises determining whether the PLD control signal 116 was issued by the PLD 115 (or at-least one PLD 115 if there are more than one PLD on the PCB 108) or the PLD control signal substitute 116a was issued by the other logic device shown as 119, then the last (most recently issued) PLD control signal 116 or PLD control signal substitute 116a will be used. For determining whether the PLD control signal 116 or PLD control signal substitute 116a was issued a plurality of LEDs (light emitting diodes) with a pre-determined sensing circuit can be used to visually detect whether the PLD control signal 116 was issued, or reset based synchronization for the PLD 115 with rest of the PCB electronics can be another approach depending on functional aspects of the system on the PCB 108. Only upon confirmation that the PLD control signal 116 or PLD control signal substitute 116a was issued does method 100 reach step 104.

Step 104 comprises determining whether there is a single power supply or there are multiple power supplies supplying power to the PCB 108. If there is a single power supply step 105 is reached which comprises enabling an electronic switch 130 to supply power from the primary power supply 110 to devices on the PCB 108 (see FIG. 2 described below). If there are multiple DC power supplies 110 step 106 is reached which comprises enabling a second power supply 125 to supply power to the other electronics 108a on the PCB 108. (See FIG. 3 described below).

In the single power supply embodiment (step 105) the primary DC power supply 110 is controlled by the PLD control signal 116 or PLD control signal substitute 116a. As noted above a plurality of such single primary DC power supplies having a plurality of different voltage levels can be provided on the PCB 108. The meaning of single power supply as used herein is a destination supply for the other electronics 108a that is identical to that is controlled by PLD control signal 116 oy by the PLD control signal substitute 116a.

In the multiple power supply embodiment (step 106) the primary DC power supply 110 as mentioned in the example embodiment is controlled by the PLD control signal 116 or PLD control signal substitute 116a with optional usage of inverter(s) 117 or the live power ON sequence algorithm 115b. A plurality of such implementation of the multiple power supplies with a plurality of voltage levels can be embodied on PCB 108. The meaning of multiple power supply comprises the source supply from the plurality of primary DC power supplies 110 and the destination supply for the rest of the other electronics 108a is non-identical, that is controlled by PLD.

Figure 2:
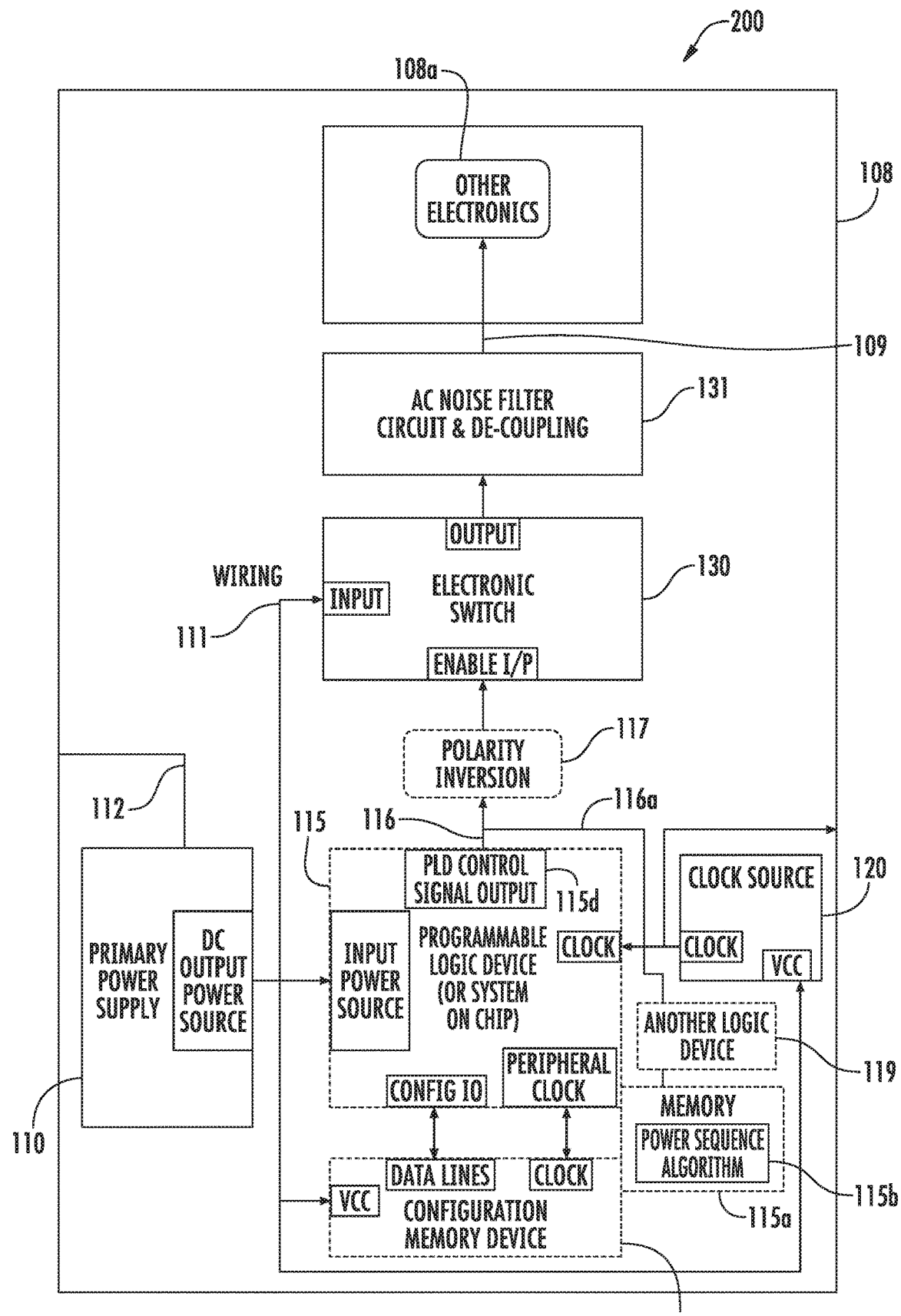
FIG. 2 shows an example system on a PCB that has a power supply power sequencer shown sequencing a single power supply, where a PLD control signal from the PLD or a PLD control signal substitute triggered by a disclosed live ON power sequence algorithm is for controlling the power-on sequencing of electronics on the PCB including the PLD and other electronics on the PCB, according to an example embodiment.
Figure 5:
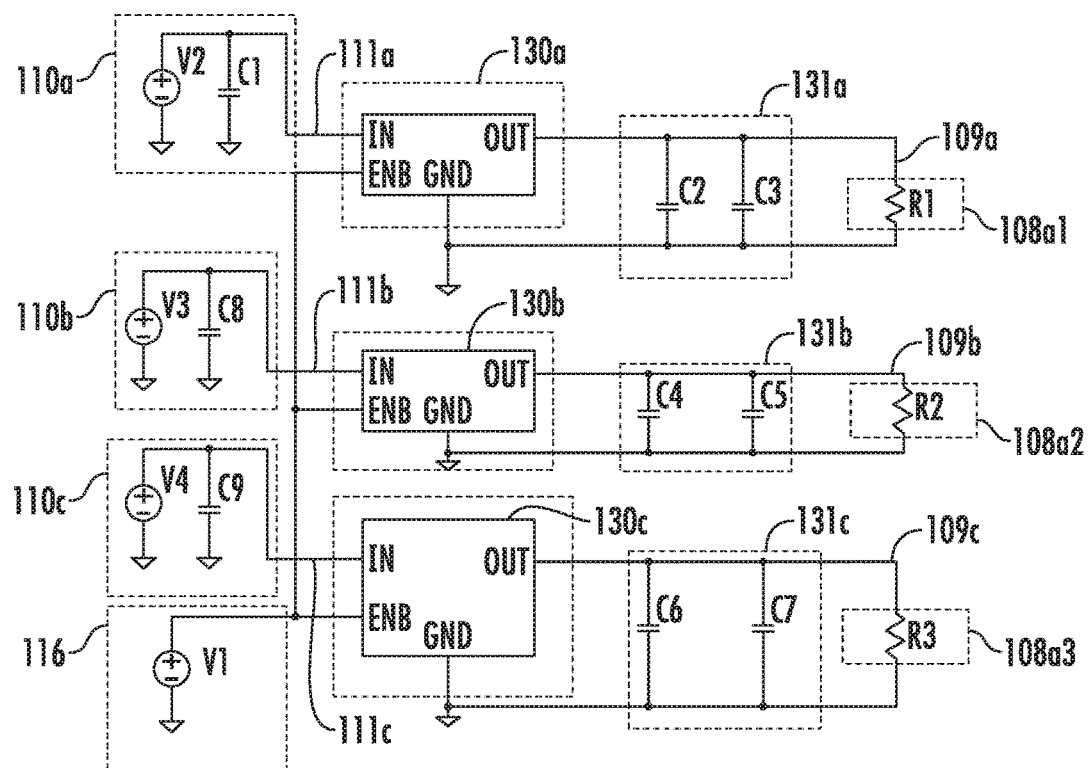
FIG. 5 shows an example operational description of the system on a PCB shown in FIG. 2 including waveform plots.
Figure 5:
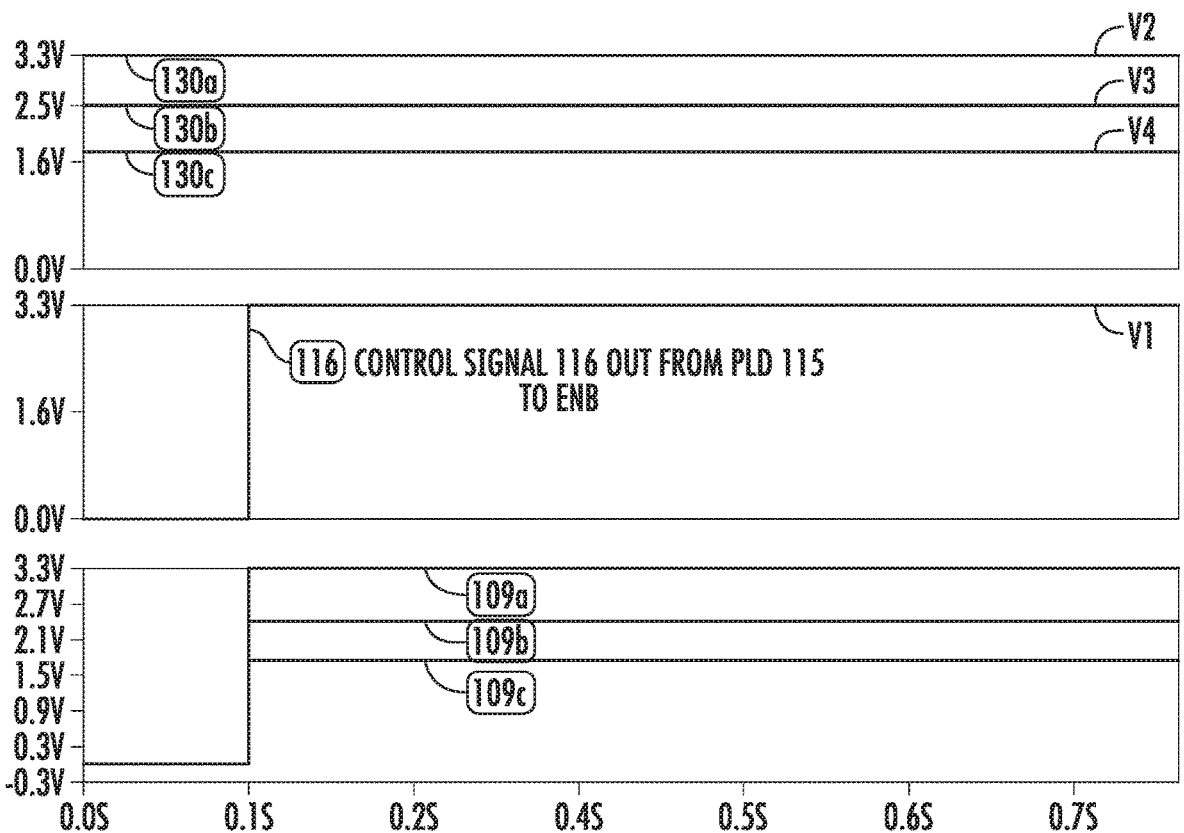

FIG. 2 shows an example system 200 on a PCB 108 that has a single-power supply, where the live ON power sequence algorithm 115b stored in the memory 115a implements controlling the power-on sequencing of the electronics on the PCB 108 including the PLD 115 and other electronics 108a (e.g., digital subsystems) on the PCB 108, according to an example embodiment. The PCB 108 can comprise a single board, or can comprise two or more PCBs. The DC primary power source wiring 111 and/or DC power source wiring 112 can each include an electronic switch to switchably supply the same DC power as received by the PLD 115 to the other electronics 108a. In some cases, an input of an electronic switch 130 which is adapted to be connected with DC primary source wiring 111 can also be connected to carry power from the primary DC power supply wiring 112 as shown in FIG. 2. An electronic switch 130 enable input is connected to receive the PLD control signal 116 or the substitute control signal 116a. When the enable input is received, the electronic switch 130 will be in an active state to supply input DC power using DC power supply wiring 112 or DC primary source wiring 111 through electronic switch 130, and thus power to other electronics 108a. Thus, this switch arrangement provides advantages in terms of accessibility of primary DC power supply wiring 112, controllability of same wiring to be used for other components such as visual indicators including LEDs and execution of diagnostic features for the similar devices on the PCB 108. FIG. 5 described below provides an example operational description for system 200 showing waveform plots.

Figure 3:
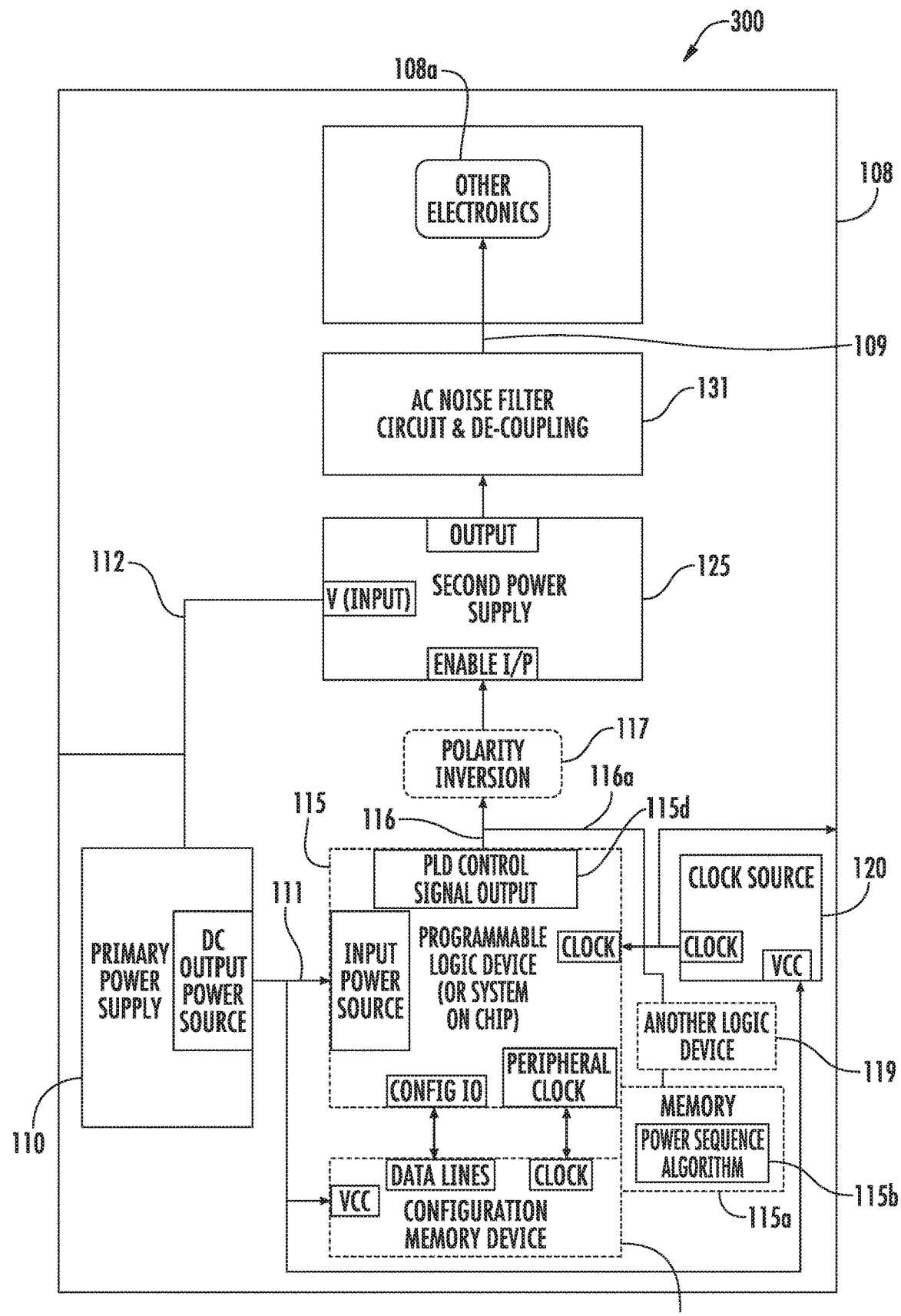
FIG. 3 shows another example system on a PCB that has a multiple-power supply sequencer shown sequencing first and second power supplies, where a PLD control from the PLD or a PLD control signal substitute triggered by a disclosed live power ON sequence algorithm is for controlling the power-ON sequencing for both the power supplies shown for powering the electronics on the PCB including the PLD and other electronics on the PCB, according to an example embodiment.

FIG. 3 shows an example system 300 on a PCB 108 that has multiple-power supplies, where the live power ON sequence algorithm 115b stored in the memory 115a implements controlling the power-on sequencing of the electronics on the PCB 108 including the PLD 115 and other electronics 108a on the PCB 108, according to an example embodiment. The PCB 108 can comprise a single board, or can comprise two or more PCBs. See FIG. 4 described below for an example operational description of system 300.

Disclosed embodiments can be applied generally to a wide variety of systems on a PCB. For example, if a system design has a CPLD, FPGA or discrete digital logic as ASICs on a PCB one can implement all the electronic devices along with one or more FPGAs with or in some case without the need for performing an initial signal level power on analysis or initial digital logic analysis for system on the PCB.

EXAMPLES

Disclosed embodiments are further illustrated by the following specific Examples, which should not be construed as limiting the scope or content of this Disclosure in any way. In this example the PLD 115 provides a PLD control signal 116.

Figure 4:
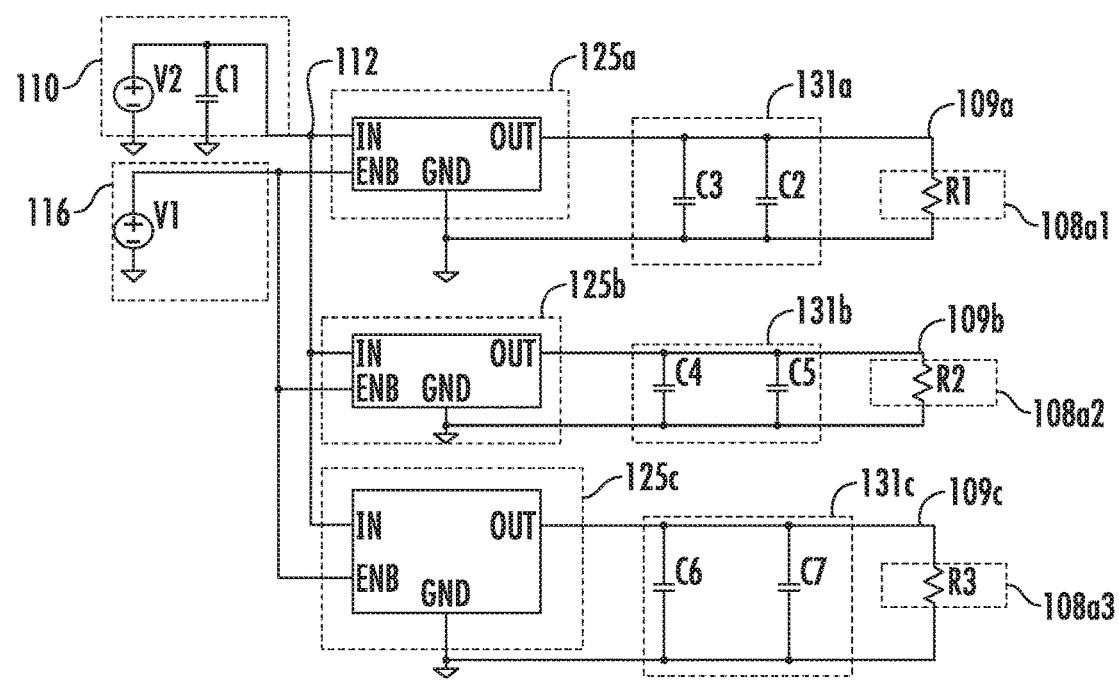
FIG. 4 shows an example operational description of the system on a PCB shown in FIG. 3 including waveform plots.
Figure 4:
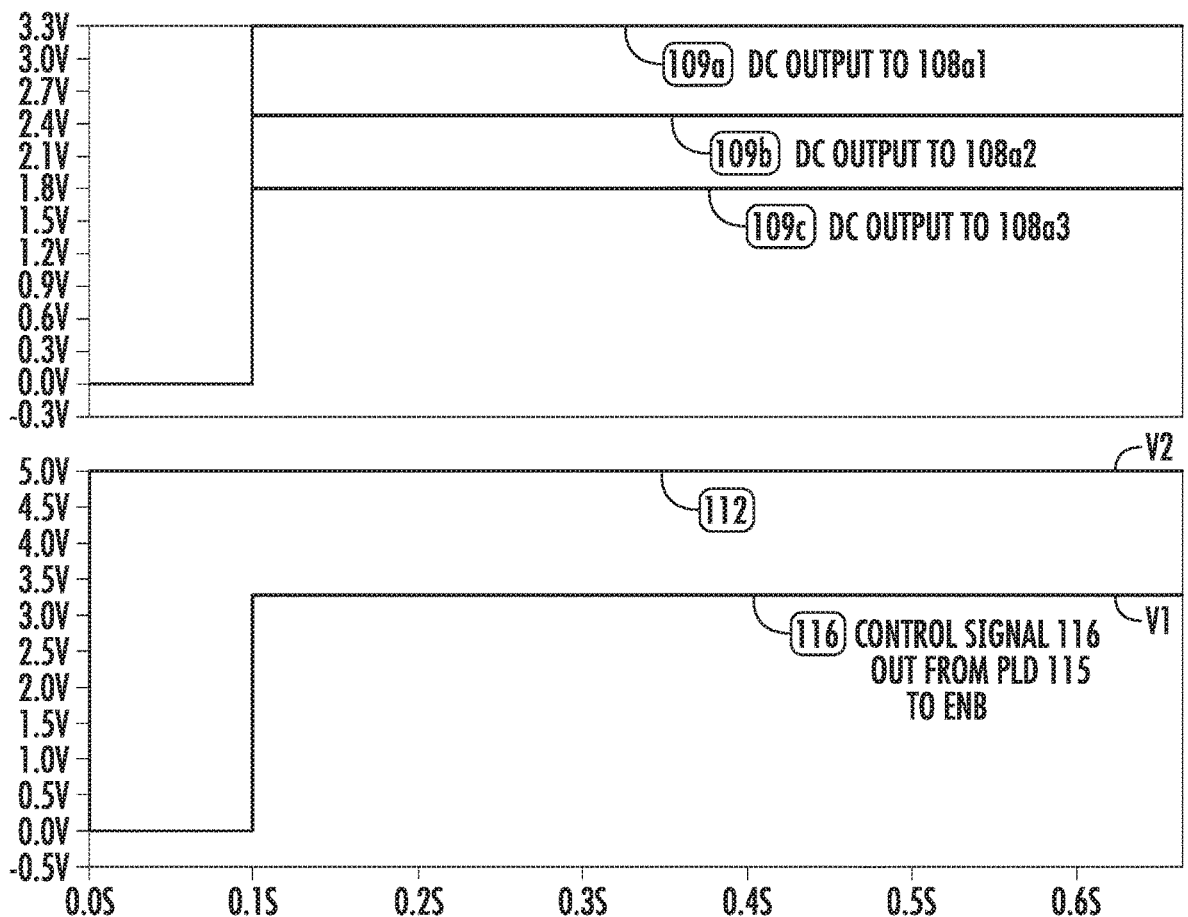

FIG. 4 describes how the secondary DC power supply 125 with three instances shown in FIG. 3 as 125a, 125b and 125c operates for powering the other electronic (e.g., digital subsystems) on the PCB having different supply voltage needs shown as 108a1, 108a2 and 108a3. The other electronics 108a1, 108a2 and 108a3 is shown for simplicity each only as single resistors, respectively.

A DC voltage which is pulsed shown as V1 is the PLD control signal 116 further referred to a configuration complete control signal or clock stable output valid control signal generated by the PLD 115 (not shown), that is coupled to an enable input (shown as ENB) of each of the secondary DC power supplies 125*a*, 125*b*, and 125*c*. The waveform at DC power source wiring 112 shown being 5V is coupled to the IN node of secondary DC power supplies 125*a*, 125*b*, and 125*c*. As described above, the PLD control signal 116 is asserted after a delay that is greater than the configuration time, for example at 100 ms (0.1 sec) as shown in FIG. 4, which is used at the ENB input to control the outputs of the secondary DC power supplies 125*a*, 125*b*, and 125*c*. During the configuration time the PLD 115 will be in a configuration mode. The configuration time varies according to selection of mode of configuration and the device manufacturer.

In FIG. 4 the secondary power supplies 125*a*, *b*, *c* generate their DC output only when the PLD control signal 116 shown at V1 functioning as an enable input (ENB) reaches the threshold level. The example levels shown generated by the instances of the secondary DC power supplies 125*a*, *b* and *c* are a DC output at 3.3V on DC output power source wiring 109*a*, 2.5V on the DC output power source wiring 109*b*, and 1.8V on the DC output power source wiring 109*c*, for the other electronic 108*a*1, 108*a*2 and 108*a*3, respectively. There are AC noise filters 131*a*, 131*b* and 131*c* shown for AC noise filtering the output from secondary DC power sources 125*a*, 125*b* and 125*c*, respectively.

FIG. 5 describes how the primary DC power supply 110 provides power to the other electronic 108*a* shown as 108*a*1, 108*a*2 and 108*a*3 (again shown for simplicity each only as single resistors) by coupling through electronic switches 130*a*, 130*b* and 130*c* demonstrating how the example system 200 on a PCB in FIG. 2 operates. A DC voltage which is pulsed shown as V1 is the PLD control signal 116 further referred to a configuration complete control signal or clock stable output valid control signal generated by the PLD 115 that is coupled to ENB that as described above is generated by PLD 115 which is asserted after a time for example as 100 ms and used to control the output of electronic switches 130*a*, 130*b* and 130*c*. During the configuration time PLD will be in configuration mode. As noted above, the configuration time varies according to selection of mode of configuration and the device manufacturer.

V2, V3 and V4 shown in FIG. 5 are voltage levels provided by primary DC power supplies 110*a*, 110*b* and 110*c* through DC primary power source wiring 111*a*, 111*b*, and 111*c* to the inputs (IN) of electronic switches 130*a*, 130*b* and 130*c*. In FIG. 5 the electronic switches 130*a*, 130*b* and 130*c* are activated and pass the input power supply at its output pin (OUT) only when the enable input provided by the PLD control signal reaches the threshold level. When the electronic switches 130*a*, 130*b* and 130*c* are enabled, The DC outputs from primary DC power supplies 110*a*, 110*b* and 110*c* shown as 3.3V, 2.5V and 1.8V are fed through the electronic switches 130*a*, 130*b* and 130*c* via the DC output power source wiring 109*a*, 109*b*, and 109*c* for powering the other electronic 108*a*1, 108*a*2 and 108*a*3.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

As will be appreciated by one skilled in the art, the subject matter disclosed herein may be embodied as a system, method or computer program product. Accordingly, this Disclosure can take the form of an entirely hardware embodiment, an entirely software embodiment (including firmware, resident software, micro-code, etc.) or an embodiment combining software and hardware aspects that may all generally be referred to herein as a "circuit," "module" or "system."

The invention claimed is:

1. A method of controlling a power-on sequence for an electronic system on a board, comprising:
providing a system comprising a printed circuit board (PCB) including at least one programmable logic device (PLD), a memory, and a live power ON sequence algorithm stored in said memory, and other electronics, wherein said PLD is connected to a primary DC power supply that beginning at a first time receives power from primary DC power supply wiring for providing DC power to said PLD, comprising:
configuring said PLD using a configuration memory device having stored PLD configuration information, wherein upon completion of said configuring, said PLD generates a PLD control signal at its output to indicate said configuration of said PLD is complete and said PLD is in its active operation mode;
at a second time after said configuration of said PLD is complete power coupling comprising coupling said primary DC power supply to a power input of an electronic switch,
wherein said PLD control signal is used as an enable signal that controls power initially arriving through said electronic switch to all of said other electronics, and
wherein said primary DC power supply comprises a plurality of primary DC power supplies each having a plurality of DC levels to said PLD and to said other electronics using a plurality of said electronic switches,
wherein coupling said primary DC power supply wiring to a power input of a second DC power supply and said second power supply comprises a plurality of said second power supplies for supplying power with a plurality of DC levels to said other electronics.

2. The method of claim 1, wherein said memory is on said PLD.

3. The method of claim 1, wherein said PLD comprises a field-programmable gate array (FPGA) or a system on a chip (SOC) comprising a programmable processor.

4. The method of claim 1, wherein said live power ON sequence algorithm triggers generation of a PLD control signal substitute that provides a same function as said PLD control signal using another logic device to indicate a configuration of said PLD is complete and said PLD is in its active operation mode, and said live power ON sequence algorithm implements a timer or counter that provides a predetermined delay time for delaying said PLD control signal substitute.

5. The method of claim 1, further comprising AC noise filtering a power output provided by said electronic switch.

6. The method of claim 1, wherein said PLD generates said PLD control signal.

7. The method of claim 1, wherein said power coupling comprises coupling said primary DC power supply to said power input of said electronic switch, and wherein said PLD control signal is used as said enable signal to activate said electronic switch.

8. A printed circuit board (PCB) having an electronic system thereon, comprising:

a board substrate having thereon at least one programmable logic device (PLD), a memory, and a live power ON sequence algorithm stored in said memory, and other electronics, wherein said PLD is adapted to be connected to a primary DC power supply that beginning at a first time receives power from primary DC power supply wiring for providing DC power to said PLD;

said PLD adapted to be configured by a configuration memory device having stored PLD configuration information, wherein upon completion of said configuring, said PLD generates a PLD control signal at its output to indicate a configuration of said PLD is complete and said PLD is in its active operation mode;

at a second time after said configuration of said PLD is complete power coupling comprising said primary DC power supply coupled to a power input of an electronic switch, wherein said PLD control signal provides an enable signal that controls power initially arriving through said electronic switch to all of said other electronics, and wherein said primary DC power supply comprises a plurality of primary DC power supplies each having a plurality of DC levels to said PLD and to said other electronics using a plurality of said electronic switches, wherein said primary DC power supply wiring coupled to a power input of a second DC power supply, and said second power supply comprises a plurality of said second power supplies for supplying power with a plurality of DC levels to said other electronics.

9. The PCB of claim 8, wherein said memory is on said PLD or elsewhere on a PCB.

10. The PCB of claim 8, wherein said PLD comprises a field-programmable gate array (FPGA) or a system on a chip (SOC) comprising a programmable processor.

11. The PCB of claim 8, wherein said live power ON sequence algorithm triggers generation of a PLD control signal substitute that provides a same function as said PLD control signal using another logic device to indicate a configuration of said PLD is complete and said PLD is in its active operation mode, and said live power ON sequence algorithm stored in said memory implements a timer or counter that provides a predetermined delay time for delaying said PLD control signal substitute.

12. The PCB of claim 8, further comprising a noise filter for AC noise filtering a power output provided by said electronic switch or by said secondary DC power supply.

13. The PCB of claim 8, wherein said PLD is configured to generate said PLD control signal.

14. The PCB of claim 8, wherein said power coupling comprises said primary DC power supply coupled to said power input of said electronic switch, and wherein said PLD control signal or said PLD control signal substitute is used as said enable signal to activate said electronic switch.

15. The method of claim 1, further comprising AC noise filtering a power output provided by said second DC power supply.

16. The PCB of claim 8, further comprising a noise filter for AC noise filtering a power output provided by said second DC power supply.

* * * * *